United States Patent [19]

Lomerson

[11] 4,319,708
[45] Mar. 16, 1982

[54] MECHANICAL BONDING OF SURFACE CONDUCTIVE LAYERS

[76] Inventor: Robert B. Lomerson, Rte. 9, Box 196, Fort Worth, Tex. 76106

[21] Appl. No.: 961,005

[22] Filed: Nov. 15, 1978

Related U.S. Application Data

[63] Continuation-in-part of Ser. No. 768,735, Feb. 15, 1977, abandoned.

[51] Int. Cl.³ ............... B23K 20/02; B23K 20/10; B23K 20/14
[52] U.S. Cl. .................... 228/111; 228/3.1; 228/44.1 A; 228/116; 228/173 C; 228/180 R; 228/219; 29/853
[58] Field of Search ........... 228/110, 111, 115, 116, 228/173 A, 173 C, 219, 179, 180 R, 3.1, 44.1 A; 29/625, 628, 853, 852; 174/68.5; 101/27, 28, 31

[56] References Cited

U.S. PATENT DOCUMENTS

| | | | |
|---|---|---|---|
| 2,776,473 | 1/1957 | Dailey et al. | 228/115 |
| 2,888,614 | 5/1959 | Barnes | 228/115 X |
| 2,889,393 | 6/1959 | Berger | 174/68.5 |
| 2,925,645 | 2/1960 | Bell et al. | 29/625 |
| 2,974,284 | 3/1961 | Parker | 174/68.5 X |
| 2,977,672 | 4/1961 | Telfer | 29/625 |
| 3,037,265 | 6/1962 | Kollmeier | 29/625 |
| 3,315,133 | 4/1967 | Walker | 174/68.5 X |
| 3,499,098 | 3/1970 | McGahey et al. | 29/625 X |
| 3,500,532 | 3/1970 | Lozano et al. | 228/116 |
| 3,531,852 | 10/1970 | Slemmons et al. | 228/110 |
| 3,557,983 | 1/1971 | Hayes et al. | 228/115 |
| 3,678,437 | 7/1972 | Vaden | 174/68.5 X |
| 3,680,209 | 8/1972 | Hacke | 228/180 R X |
| 3,865,298 | 2/1975 | Allen et al. | 228/20 X |
| 3,926,357 | 12/1975 | Matrisian | 228/110 |
| 3,969,815 | 7/1976 | Hacke et al. | 29/625 |

FOREIGN PATENT DOCUMENTS

635115 4/1950 United Kingdom ............ 101/31

Primary Examiner—Gil Weidenfeld
Assistant Examiner—K. J. Ramsey
Attorney, Agent, or Firm—Richards, Harris & Medlock

[57] ABSTRACT

An electrically conductive path through an insulating plate (10) is produced by forcing sheets of conductive material (13, 14) into contact through a hole (11) in the plate (10). The sheets (13, 14) are forced together with sufficient force to produce a cold weld junction, which is then plated with a conductive metal (102). Dies for producing the cold weld utilize metallic spheres (110), rods (188) or chemically etched projections (228). Shaped dies (268, 272) form a crimped joint without a cold weld, and offset dies (246, 250) produce a raised junction (252) for use as a mount for a planar component. In manufacturing a printed circuit board (160) the cold weld die (158) is produced with the same drill hole pattern as used to form the drill holes in the printed circuit board (160).

48 Claims, 33 Drawing Figures

MECHANICAL BONDING OF SURFACE CONDUCTIVE LAYERS

This application is a continuation-in-part of application Ser. No. 768,735 filed Feb. 15, 1977, now abandoned.

TECHNICAL FIELD

This invention relates to electrical component mounting boards and more particularly to a method for forming an electrically conductive path through a plate of insulating material.

BACKGROUND ART

A number of methods have been developed for providing an electrical connection through an insulated plate, such as a printed circuit board, for connecting conductive lines on different surfaces of the plate. Currently the most widely used method is the plated-through hole. This method of plating requires numerous steps which include the use of various chemical baths and metal plating solutions. These baths and solutions must be carefully adjusted to the proper concentration to maintain the correct chemical balance to carry out the plating operation. Another technique for forming a conductive path through a plate is the use of eyelets or conductive stakes which are mounted in holes that have been formed in the insulating board.

It is an object of this invention to provide a through connection without the use of chemical baths and without the need for inserted conductive devices or soldered connections.

Due to the wide use of printed circuit boards in the industry and to the expense involved in currently producing plated-through holes, there exists a need for a method for producing a conductive through connection which is simpler and less expensive. In addition there exists a need for a method to form the through connections in dense, complex arrangements by means of easily manufactured dies.

DISCLOSURE OF THE INVENTION

In accordance with the present invention, a method is provided for establishing a conductive path through an insulating plate. A hole is first formed through the insulating plate in the location for the through connection. Sheets of conductive metal, generally in the form of interconnecting conductor lines, are placed into flush contact on each side of the insulating plate covering the through hole. Opposing dies on opposite sides of the insulating plate are forced together with at least one of the dies having an upstruck member aligned with the through hole. The dies deform the sheets of conductive metal into contact through the hole in the insulating plate. The forces on the dies are of sufficient magnitude to cause the deformed sheets to metallurgically bond in the zone of contact. The bonding is facilitated by the inclusion of one or more added processes. The magnitude of the force required to form the cold weld is reduced by vibrating the sheets while they are pressed in contact, heating the conductive metal while the bond is being formed, or carrying out the bonding operation in an inert atmosphere to produce a fusion weld.

In accordance with another aspect of the present invention a sized hole is formed through bonded metal conductors within a hole through an insulating plate. After the bond has been formed a plate with an upstanding pin aligned with the hole is brought against the plate so that the pin penetrates the metal in the zone of the hole. The size of the pin and the extent of penetration is selected to form a hole of the size necessary for insertion of a component lead.

In accordance with another aspect of the present invention a method is provided for forming an electrically conductive path through an insulating plate by driving conductive sheets together through a hole in an insulating plate with insufficient force to form a metallurgical bond but sufficient to penetrate the conductive sheets. A connection is formed by covering the conductive sheets in the zone of contact with a layer of conductive metal.

In accordance with another aspect of the present invention, a through-hole connection is formed by crimping the opposed conductive sheets to form a mechanical and electrical connection but without a cold weld between the conductive sheets. Shaped dies are utilized to accomplish the crimping of the facing conductors. After the connection is formed, the sheets are plated with a metal to insure that there is a reliable mechanical and electrical joint.

In accordance with another aspect of the present invention a method is provided for producing an electrical component mounting board having conduction lines on opposite faces of an insulating plate with the conduction lines electrically connected through holes in the insulated plate at selected locations. The method comprises the steps of selecting a foil conduction pattern for each side of the insulating plate, selecting a through-hole pattern for providing the electrical interconnections through the plate, forming holes in the insulating plate in accordance with the through-hole pattern, forming struck up members on a first plate in accordance with the selected through-hole pattern, positioning the foils and insulating plate in alignment between the first plate and a second plate and forcing the first and second plates together with a force of sufficient magnitude to cause a cold weld to be formed between the opposing foil members in the zones of the through-holes.

In accordance with a still further aspect of the present invention, an electrical connection is formed by punching through an insulating plate having conductors on opposite sides. The punch through forms a hole in the insulating plate and connects the conductors which are then coated with a layer of conductive metal.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

DETAILED DESCRIPTION

Figure 1:
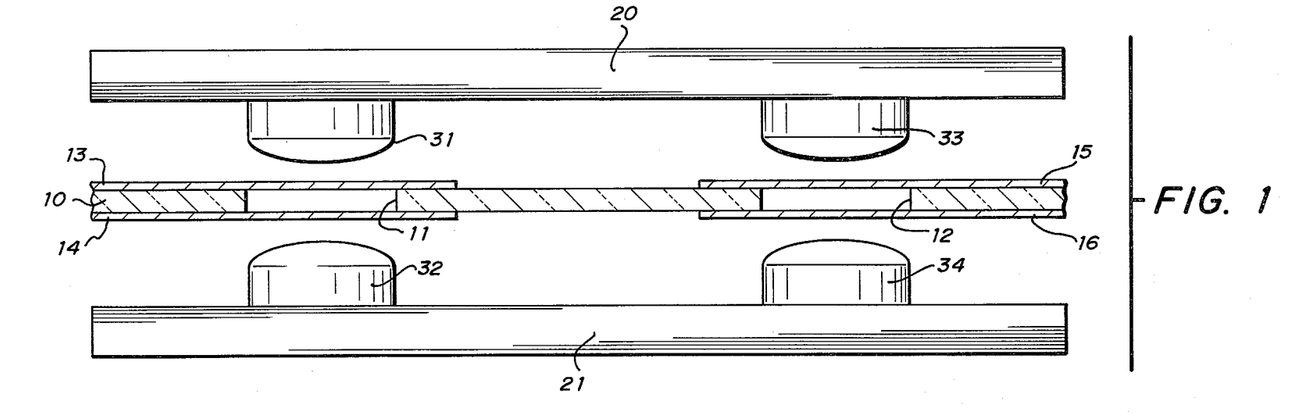
FIG. 1 is an elevation view of symmetrical bonding dies, an insulating plate and conductive sheets.

Referring to FIG. 1, an insulating plate has formed therein holes 11 and 12. Disposed on either side of the insulating plate 10 are conducting sheets 13 and 14 covering hole 11 and conductive sheets 15 and 16 covering hole 12. Located on either side of the insulating plate 10 are dies 20 and 21. Die 20 has a struck up die face 31 facing hole 11 and a struck up die face 33 facing hole 12. Similarly, die 21 has a struck up die face 32 facing hole 11 and a struck up die face 34 facing hole 12.

Figure 2:
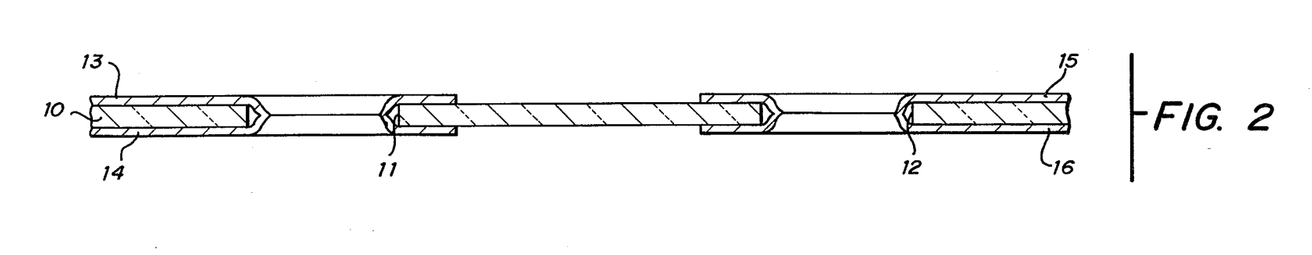
FIG. 2 is an elevation view of the insulating plate of FIG. 1 in which the opposing conductive sheets have been bonded.

The insulating plate 10, after the conducting sheets have been metallurgically bonded, is illustrated in FIG. 2. Sheets 13 and 14 have been bonded together with a cold weld within hole 11 while sheets 15 and 16 have been bonded together within hole 12.

Operation of the present invention is now described in reference to FIGS. 1 and 2. As a first step holes 11 and 12 are formed in a plate of insulating material 10 at the locations desired for through hole connections and for installation of component leads. After the required holes are formed sheets of electrically conductive material such as, for example copper or aluminum, are placed into flush contact with each side of the insulating plate 10 so that the holes 11 and 12 are covered on both sides.

Dies 20 and 21 are located on either side of the insulating plate 10 and have included theron die faces 31 through 34 which are made of a material such as hardened steel. The die faces are formed in pairs such as 31 and 32 and pairs 33 and 34, with other pairs also arranged in mutual opposition. To form the through hole connection the insulating plate 10 is disposed between dies 20 and 21 with the holes 11 and 12 respectively aligned between the die face sets 31, 32 and 33, 34. After alignment the dies 20 and 21 are brought together so that the die faces 31 and 32 distort the conducting sheets 13 and 14 into the hole 11 while the die faces 33 and 34 distort the conducting sheets 15 and 16 into hole 12. The conductive sheets are progressively bent inward until they meet. After the plates meet, the force on the dies 20 and 21 is made sufficiently great so that a cold weld is formed between the contacting conducting sheets. The resulting configuration is illustrated in FIG. 2.

The mechanics of creating a cold weld in accordance with the present invention can be carried out in a number of ways. In the simplest form, the die faces 20 and 21 can be driven together with a force of sufficient magnitude such that the force alone causes a cold weld to be formed between the opposed conducting sheets. The cold weld can be produced with lesser force if the sheets 13 and 14 as well as 15 and 16 are vibrated ultrasonically by the dies 20 and 21 while the dies force the sheets together.

As a further bonding technique, the pressure exerted by the die faces is combined with the enclosing of the insulating plate and dies in an atmosphere of inert gas such as helium or argon. This is termed diffusion welding. For optimum results the conducting sheets must have a clean surface before bonding takes place. When the sheets are driven together within the inert atmosphere the magnitude of force required to produce the bond is significantly less. The inert atmosphere eliminates the oxide layer which normally forms on the sheets and inhibits the formation of a bond.

The bonding can also be performed by any combination of the factors mentioned above including force, vibration, heating and diffusion welding within an inert gas.

Figure 3:
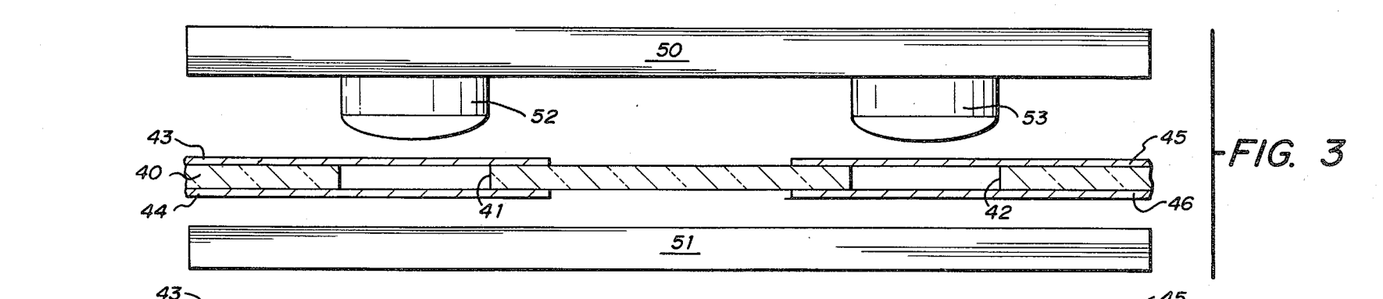
FIG. 3 is an elevation view of a single die, base plate, insulating plate and conductive sheets.

The bond produced between the conducting sheets 13, 14 and 15, 16 can be either a layer or, if sufficient force is applied, the dies can penetrate the conducting sheets and form a hole in the junction between the sheets. If the dies penetrate the conducting sheets, the junction thus formed is in a ring shape. A hole can also be produced in the junction of the conducting sheets by including a small step feature on the surface of the die face on one side with an insert for receiving the die face step on the second side. Referring to FIG. 3, holes 41 and 42 are formed in insulating plate 40 with conductive sheets 43 and 44 on either side thereof. Conductive sheets 45 and 46 are placed on opposite surfaces of plate 40 to cover hole 42. A die 50 has a die face 52 thereon with the die face facing hole 41. A second die face 53 on the face of die 50 faces hole 42. On the opposite side of the insulating plate 40 from the die 50 is a second die 51 having a flat surface.

Figure 4:
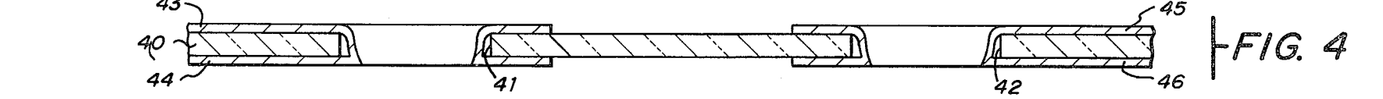
FIG. 4 is an elevation view of the insulation plate of FIG. 3 in which the opposing conductive sheets have been bonded.

The conductive sheets are shown in the bonded state in FIG. 4. Sheets 43 and 44 have been joined together within hole 41 while sheets 45 and 46 have been bonded together within hole 42.

FIGS. 3 and 4 show a similar bonding configuration and procedure to that illustrated for FIGS. 1 and 2 except that there is only one die with protruding die faces. The conductive sheets are bonded together as a result of force exerted by the die faces 52 and 53 against plate 51. The only difference from the previous techniques is that the area of contact is in the plane of the lower sheets, 44 and 46, rather than within the center of the holes 41 and 42.

Figures 5, 6:
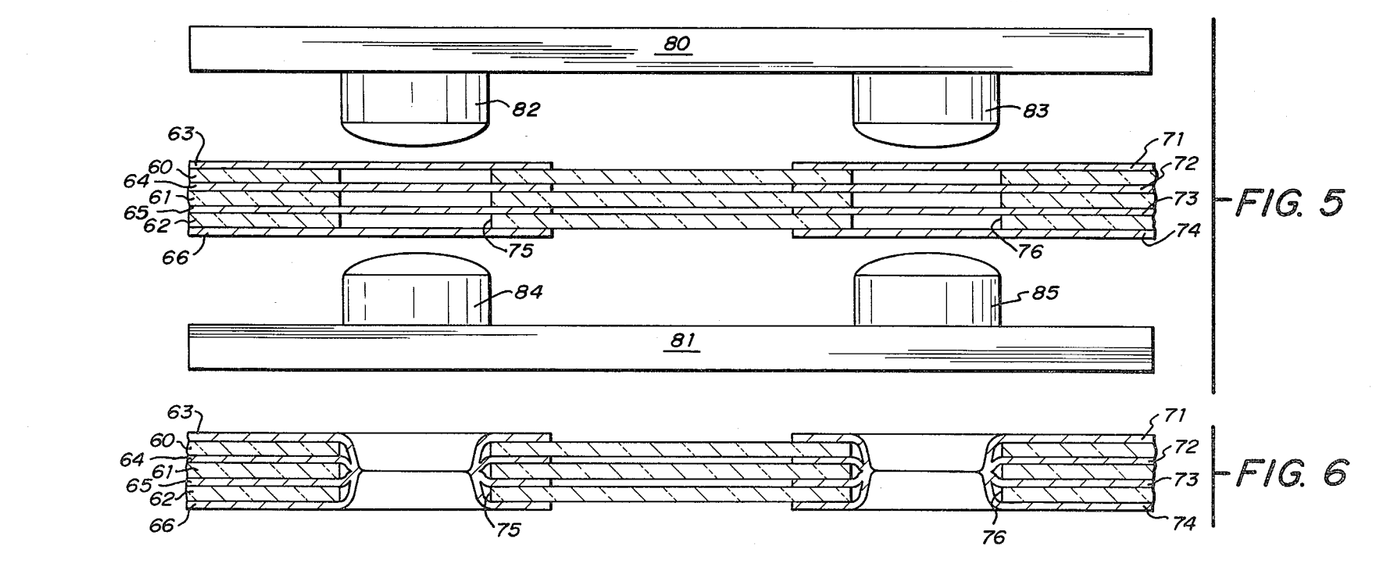
FIG. 5 is an elevation view of symmetrical bonding dies, multiple insulating plates and multiple conductive sheets.
FIG. 6 is an elevation view of the insulating plates of FIG. 5 in which the multiple conductive sheets have been bonded.

Referring to FIG. 5 there is shown a multilayer circuit board having insulating plates 60, 61 and 62 having holes 75 and 76 formed therethrough. Stacked in alignment between the insulating plates 60 through 62 and covering the hole 75 are conducting sheets 63, 64, 65 and 66. Likewise conducting sheets 71, 72, 73 and 74 are located to cover hole 76 in insulating plates 60, 61 and 62.

Dies 80 and 81 are disposed on either side of the insulating plate 60. Die 80 has struck up die faces 82 and 83 opposite holes 75 and 76 respectively. Die face 81 has struck up die faces 84 and 85 facing holes 75 and 76, respectively.

Referring to both FIGS. 5 and 6 there is shown an embodiment of this invention wherein multiple layers of conductive sheets are electrically and mechanically connected. The mechanical bonding of the multiple layers is performed in the same manner as previously described. In addition multiple layers could be connected using only one die with die faces as shown in FIGS. 3 and 4.

The preferred embodiment for the bonding of the conductive sheets is cold welding together with ultrasonic vibration as described above. Another techique is diffusion welding in which the metals to be joined are cleaned and forced together in an environment comprising an inert gas. A further technique comprises heating the metal sheets to near their melting point then forcing them together to form a mechanical and electrical bond. Further, conventional welding techniques, such as electrical welding, can be utilized to join the sheets after they have been forced together by the die faces.

Although sheets of metal have been used in the description of the previous embodiments of the present invention, it is to be understood that wires or metallic ribbons can also be so joined. Also, any combination of sheets, wires or ribbons can be utilized.

After a junction has been formed by means of the cold weld technique described above, it is desirable to improve the solderability of the conductive material adjacent the junction by coating the conductive material with an additional metallic layer. The addition of a conductive layer in this manner is described in reference to FIG. 7. The basic junction is that produced as shown in FIG. 4 wherein the conductive materials in the zone of the junction have been pierced to form a through-hole.

Figure 7:
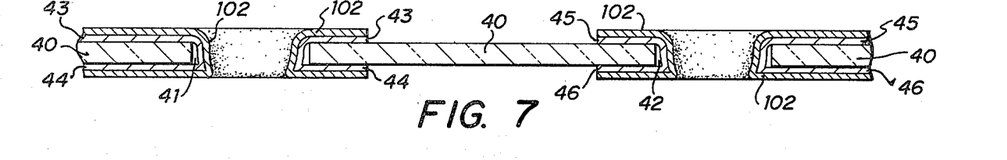
FIG. 7 is an elevation view of compression bonded sheets with a metallic covering over the junction.

A conductive layer of solder is coated over the conductive layers 43, 44, 45, and 46 by passing the entire assembly through a conventional wave solder machine or by dipping in molten solder. This process deposits a layer of solder 102 over the surfaces of each of the conductive layers. The layer of solder 102 provides additional mechanical strength in the area of the through-hole as well as providing a surface to which a solder connection can be easily made after a component lead is inserted into the through-hole.

As an alternative procedure, a conductive layer can be plated onto the existing conductive layers 43, 44, 45, and 46 in place of the solder layer 102. This layer is added by conventional electroplating or electroless plating of a metal such as, for example, copper. An additional solder layer can be provided over the plated metal.

Figures 8, 9:
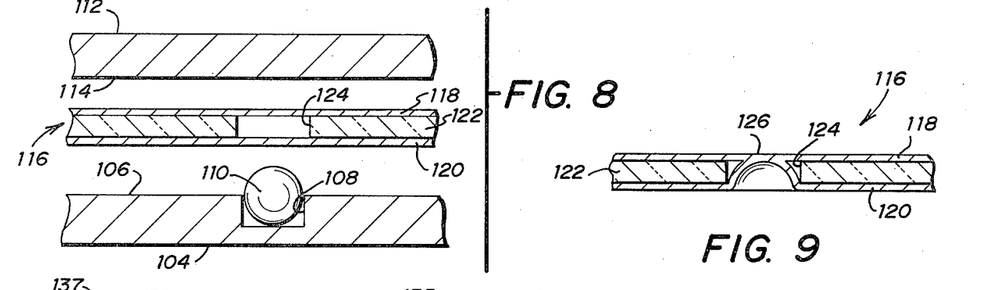
FIG. 8 is an elevation view of a compression junction die using a metallic sphere.
FIG. 9 is an elevation view of a junction between conducting sheets as formed by dies shown in FIG. 8.

A die set for producing a cold weld junction in accordance with the present invention is illustrated in FIG. 8. A metal plate 104 has formed in the die face 106 a hole 108. The hole is formed at the point on the die face 106 where it is desired to locate a projection to form a cold weld junction. A metal sphere 110, such as a ball bearing, is placed in the hole 108 and is of such a size to project above the surface of the die face 106. This forms a struck up member on the die face 106. An opposing die plate 112 has a smooth and flat die face 114.

Located between the die faces 106 and 114 is a printed circuit board 116 having conductive sheets 118 and 120 on each face of an insulating plate 122. Insulating plate 122 can be, for example, a sheet of MYLAR (trademark of Dupont) or an epoxy board while the conducting sheets are, for example, copper or aluminum foils. A hole 124 is formed in the insulating plate 122 at the location at which it is desired to form an electrical connection between the conducting sheets 118 and 120.

The metal sphere 110 is held in place in the hole 108 by means of an adhesive, by welding, by brazing or mechanically entrapping the sphere to the die 104.

To form an electrical connection between the conducting sheets, the die plates 104 and 112 are forced together with such pressure that the metal sphere 110 deforms the conducting sheet 120 through the insulating plate 122 into contact with the conducting sheet 118. The sheets are then forced against the die face 114. The force of the metal sphere 110 against the conducting sheets 118 and 120 is such that the sheets are cold welded together at the point of contact to form a mechanically reliable electrical connection.

The connection formed by the operation described in FIG. 8 is illustrated in FIG. 9. The conducting sheets 118 and 120 are welded together to form a junction 126. In this embodiment the conducting sheet 118 remains flat and the junction 126 does not project above the plane of sheet 118. If greater pressure is applied in forcing the dies 104 and 112 together, the metal sphere 110 will penetrate both the conducting sheets 118 and 120 and form a through-hole passing completely through the board 116 in the hole 124. Such a through-hole provides a passage for the mounting of the leads of an electrical component on the board 116. A layer of metal can be added over junction 126 for greater strength and ease of component mounting. This layer is the same as shown in FIG. 7.

Figures 10, 11:
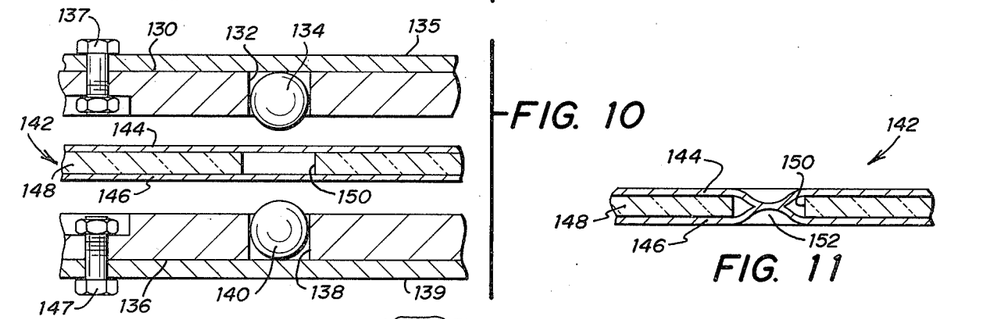
FIG. 10 is an elevation view of compression bonding dies in which the junction is formed by opposed metallic spheres disposed in the die faces.
FIG. 11 is an elevation view of a junction formed between conductive sheets by use of the dies shown in FIG. 10.

An alternative method of using metal spheres to form a cold weld junction is illustrated in FIG. 10. A die plate 130 has a hole 132 formed therein with a metal sphere 134 fixed in place within the hole. A flat metal plate 135 is connected to die plate 130 for support and to properly position sphere 134. Plates 130 and 135 are connected by bolt 137. A similar type plate 136 has a hole 138 with a metal sphere 140 disposed therein. Plate 136 is supported by plate 139 and the plates are joined by bolt 147.

A board 142 having conductive sheets 144 and 146 disposed on either side of an insulating plate 148 is positioned between the dies 130 and 136. A hole 150 in the insulating plate 148 is aligned between the metal spheres 134 and 140. When the die plates 130 and 136 are brought together the metal spheres 134 and 140 compress the conducting sheets 144 and 146 into the hole 150 until they come into contact. The force on the conducting sheets is such that the sheets bond together to form a cold weld junction which provides a mechanical and electrical connection between the sheets. If greater force is applied, the conducting sheets 144 and 146 are punctured and a through-hole is formed therein.

The junction formed in the board 142 is illustrated in FIG. 11. Junction 152 is spaced within the hole 150. The bond between the conducting sheets is made at the point of contact between the spheres 134 and 140. A layer of either solder or plated metal can be applied after the junction has been made to increase mechanical strength and solderability in the same manner as that shown for the junction illustrated in FIG. 7.

Figure 12:
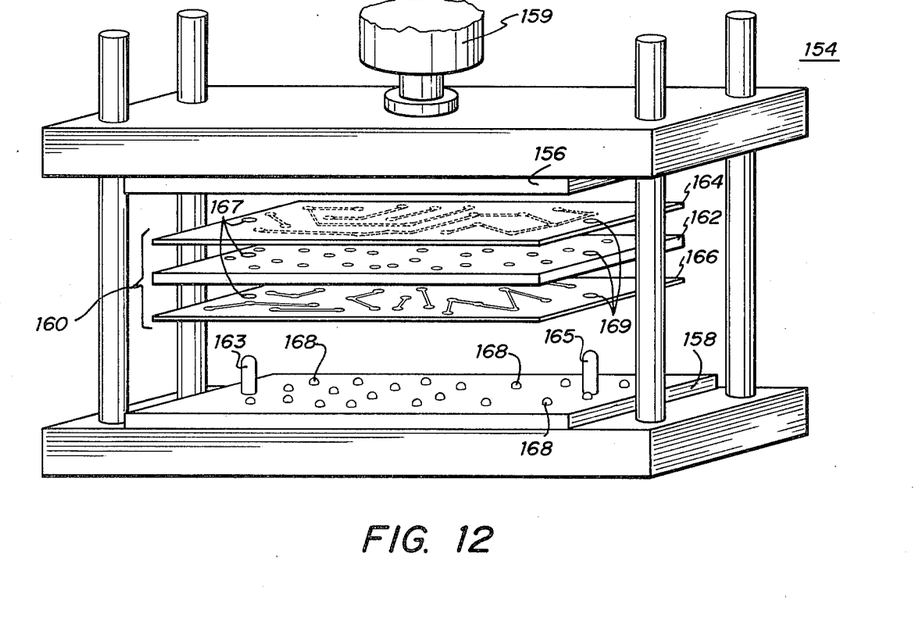
FIG. 12 is a perspective view of a press which utilizes a plurality of metallic spheres disposed in holes in a plate and utilized to form a compression bond.

The manufacture of a complete component board is illustrated in FIG. 12. A press 154 comprising an upper die 156 and a lower die 158 is designed so that the two dies can be brought together to compress material disposed between the dies. The upper die 156 is driven downward by a hydraulic ram 159. A component board 160 which is to be compressed in the press 154 is made of up to three layers. The center layer is an insulating plate 162 such as a sheet of MYLAR which has had a series of holes formed therein through which electrical connections are to be made. The upper sheet 164 comprises a pattern of conductive lines laid out to produce the desired interconnections. A lower sheet 166 also comprises a layout of conductive paths for component interconnection. The conductive lines for each sheet are supported by a backing such as MYLAR. Each of the sheets 164 and 166 has a conductive path covering one of the holes in the insulating plate 162 so that a connection can be made illustrated in FIG. 13. A component board 172 has an upper conducting strip 174, an insulating sheet 176 and a lower conducting strip 178. A hole 180 is formed in the insulating sheet 176 between the conducting strips 174 and 178. An upper die 182 has a flat face while a lower die 184 has a hole 186 formed therein which is in alignment with the hole 180 in the component board 172. Disposed within the hole 186 is a rod 188 with a rounded head 188a. Rod 188 forms a struck up member. Lower die 184 is joined to a supporting plate 190 by means of a bolt 192. The rod 188 is sized to pass through the hole 180.

Figures 13, 14:
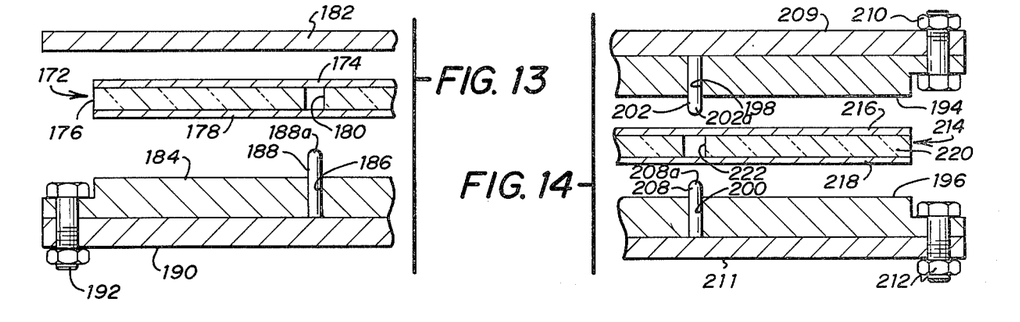
FIG. 13 is an elevation view of compression bonding dies in which a projecting rod forms the compression junction.
FIG. 14 is an elevation view of compression bonding dies in which a pair of opposed projecting rods is utilized to form the compression junction.

In forming an electrical connection the dies 182 and 184 are forced together which brings the rod heads 188a into contact with the conducting strip 178. As the rod head 188a enters the hole 180 the conducting strip 178 is deformed into the hole and into contact with the conducting strip 174. Continuing pressure by the dies forces the rod head 188a to compress the conducting strips against the die 182 until a cold weld is formed between the conducting strips 174 and 178. The resulting connection is the same as that shown in FIG. 9.

Apparatus for compressing the conductive strips from both sides into an insulating layer is illustrated in FIG. 14. Dies 194 and 196 have disposed therein respectively holes 198 and 200 in alignment with each other. A rod 202 with a rod head 202a is disposed in the hole 198. Likewise, a rod 208 with a rod 208a is disposed in the hole 200. The rod heads 202a and 208a are disposed to oppose each other.

Between the dies 194 and 196 is a component board 214 having conducting strips 216 and 218 on either side of an insulating plate 220. A hole 222 is formed in the insulating plate 220 in alignment with the rod heads 202a and 208a.

As the dies 194 and 196 are brought together the rod head 202a deforms the conducting strip 216 into the hole between the sheets 164 and 166 at the point of each of these holes.

The lower die 158 has disposed therein a pattern of holes corresponding to the holes in the insulating plate 162. Disposed within each of the holes is a metal sphere 168 which is dimensioned to protrude above the surface of the face of the lower die 158. The face of the upper die 156 is flat.

The sheets of the component board 160 are aligned between the dies 156 and 158 by alignment rods 163 and 165 so that the holes in the insulating sheet 162 as well as the connection points on the sheets 164 and 166 are over the corresponding metal spheres 168 in the lower die 158. As the dies 156 and 158 are brought together by the ram 159 the metal spheres 168 deform the conduction paths on the sheet 166 through the insulating plate 162 into contact with the conducting strips on the conducting sheet 164. Sufficient pressure is applied to force the dies together so that the force of the metal spheres 168 against the upper die 156 is such that the conducting strips on the sheets 164 and 166 are cold welded together.

In addition to the mechanical and electrical bonding which takes place at the holes within the insulating sheet 162, an adhesive can also be applied to the surfaces of the various sheets so that the compression operation also bonds the three sheets together to form a mechanically strong integral unit. A plurality of insulating sheets and conducting strips can be pressed at one time to produce multilayer boards. Further, any of the dies described herein can be used in press 154 in place of die 158 and die 156. The additional steps of vibration, heat and diffusion in an inert gas are applicable in this process just as described above.

The connection formed at each hole in the insulating sheet 162 is as shown in FIG. 9.

A further embodiment of the present invention for forming a cold weld between conductive members is 222. Likewise the rod head 208a deforms the conducting strip 218 into the hole 222. Within the hole 222 the conducting strips are forced into contact with such force as to form a cold weld junction between the strips. If the force is made greater than that necessary just to form a cold weld, a through-hole will be punched through the zone of the connection to allow for installation of component leads. Or, the rod heads 202a and 208a can be shaped so as to punch through the conducting strips 216 and 218 while at the same time forming a cold weld between the strips. The weld produced in this operation with the use of rounded rod heads is similar to the weld shown in FIG. 11. The weld itself is located within the hole 222.

The cold weld process described above can be enhanced by vibrating the dies holding the spheres or rods at an ultrasonic frequency to clean the exposed surfaces.

The rod heads 208a and 188a as shown in FIGS. 13 and 14 are rounded, however, the heads may be of other shapes as well, such as, for example flat, stepped or ridged. A nonsmooth shape can not only produce the cold weld junction as described but can penetrate the conductive layers to form a through-hole.

Figure 15:
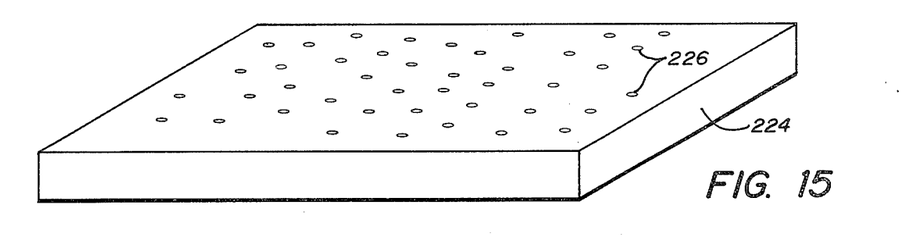
FIG. 15 is a perspective view of a metallic plate having a chemical resist printed on the surface thereof.

An additional method for forming a die for producing the cold weld junctions of the present invention is illustrated in FIG. 15. A metallic plate 224 is imprinted with a pattern of dots 226 comprising a chemically resistive material such as RISTON (trademark of DuPont). The surface of the metallic plate 224 on which the dots 226 are imprinted is then exposed to a chemical bath, which for a steel plate is ferric chloride, which chemically reacts with the metal to etch the surface of the metallic plate 224 except in the locations of the dots 226.

Figure 16:
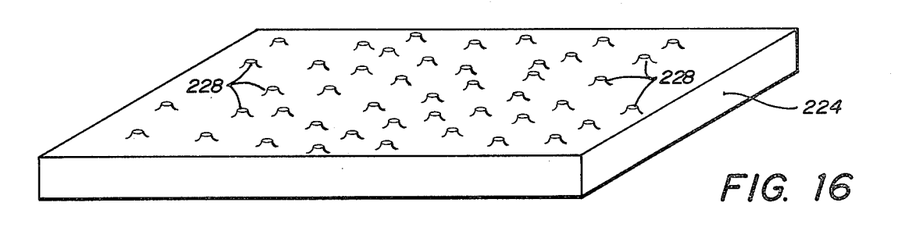
FIG. 16 is a perspective view of the plate in FIG. 15 after being chemically milled or electrochemically formed.

The resulting die is illustrated in FIG. 16. After the chemical etching liquid and the resist material are washed from the surface of the metallic plate 224, there are left remaining islands 228 which are raised above the new surface of the plate 224. Each of the islands is located at the point of deposition of the chemically resistive ink which was used to form the dots 226. The die 224 thus produced can be used to produce cold welds in the same manner as that described for the lower die 158 which is illustrated in FIG. 12. In a typical application the islands 228 will rise only a few thousandths of an inch above the etched surface of the plate 224. This procedure can be performed with numerous types of metal including both soft and hardened steel.

A die as illustrated in FIGS. 15 and 16 can also be produced by substantially covering the plate 224 with the resistive material described above. The surface of the plate 224 is covered except for the areas of the dots 226. A plating, such as chrome or nickel is then applied to the plate to build up the islands 228 above the existing surface. A die produced by such a plating procedure is similar to plate 224 shown in FIG. 16.

Figure 17:
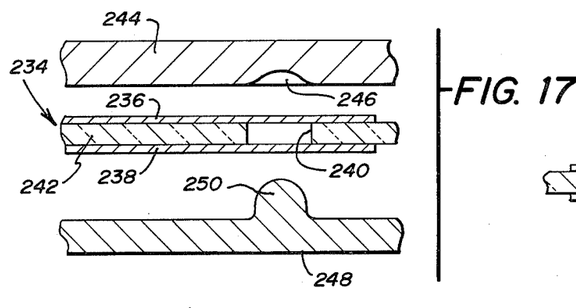
FIG. 17 is an elevation view of compression dies in which one face has a concave recession.

In applications where a specialized discrete planar component such as a surface mounted capacitor or resistor is to be mounted on a component board, such a mounting can be more easily accomplished if the point of connection on the board is raised above the surrounding surface to form an offset junction. This procedure is illustrated in FIG. 17. A component board 234 to which such a component is to be mounted comprises an upper conducting strip 236 and a lower conducting strip 238 on either side of a hole 240 in an insulating plate 242. An upper die 244 has a concave recession 246 formed in the die face thereof. A lower die 248 has a projection 250 extending above the die face. The projection 250, the concave depression 246 and the hole 240 are produced to be in alignment.

When the dies 244 and 248 are brought together the projection 50 deforms the conducting strip 238 into the hole 240 until it contacts the conducting strip 236. The projection then continues to deform both of the conducting strips until the projection 250 mates with the concave depression 246. The depression is sized so that a substantial force is exerted on the conducting strips 236 and 238 between the projection 250 and the depression 246. This force is of such magnitude as to produce a cold weld junction between the conducting strips. The bonding processes using heat, vibration, and diffusion in an inert atmosphere as described above are equally applicable to the process described in FIGS. 17 and 18.

Figure 18:
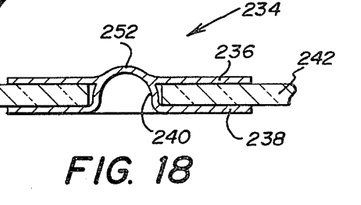
FIG. 18 is an offset compression bond formed between conductive sheets by the dies shown in FIG. 17.

The weld produced by the operation described in FIG. 17 is illustrated in FIG. 18. A junction 252 has been formed between the conducting strips 236 and 238 with the junction lying above the plane of the conducting strip 236. The cold weld which has been produced provides not only an electrical contact but a mechanical bond between the two conducting strips. The junction 252 produced in this manner provides an improved mounting point for planar components. The planar component can be made with conducting pads which align with the raised junctions. Wtih solder coatings on either or both the planar component and raised junction, the component can be mounted by placing it over the raised junctions and heating or soldering the contact points. The raised surface, as opposed to a flat surface, also provides an improved electrical contact.

Both of the dies 244 and 248 as described in reference to FIG. 17 can be produced with the method described in reference to the die 224 illustrated in FIGS. 15 and 16. The methods using metallic spheres and rods can also be used to make these dies.

Figure 19:
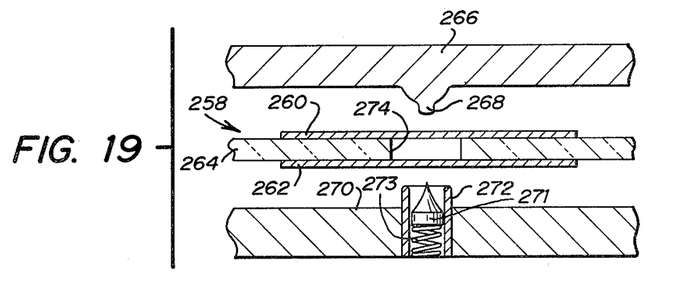
FIG. 19 is an elevation view of fold bonding dies.
Figure 20:
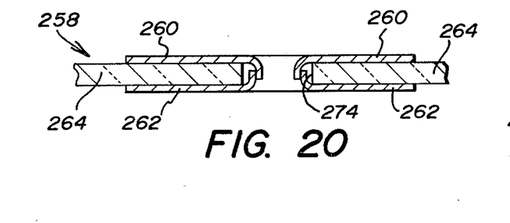
FIG. 20 is an elevation view of a folded connection formed between conducting sheets by the dies shown in FIG. 19.

An electrical connection can also be made between conducting strips on either side of insulating sheet by forcing the strips together without sufficient force for bonding them with a cold weld. This technique is illustrated in FIGS. 19 and 20. A component board 258 has an upper conducting strip 260 and a lower conducting strip 262 disposed on either side of an insulating sheet 264. The component board 258 is disposed between an upper die 266 having a cylindrical projection 268 with a rounded head disposed thereon. A lower die 270 has a raised circular ridge 272 on the die face for receiving the cylindrical projection 268. Included within ridge 272 is a projecting pin 271 backed up by a spring 273. The cylindrical projection 268 and the ridge projection 272 are disposed on either side of a hole 274 in the insulating sheet 264.

When the dies 266 and 270 are brought together the projection 268 penetrates the conducting strip 260 while the projecting pin 271 penetrates the conducting strip 262. These projections tear the conductors while they deform then into the hole 274. The force driving the dies together is sufficient to fold the conducting strips 260 and 262 in a roughly circular fashion within the hole 274 while not producing a cold weld between the two strips.

Figure 21:
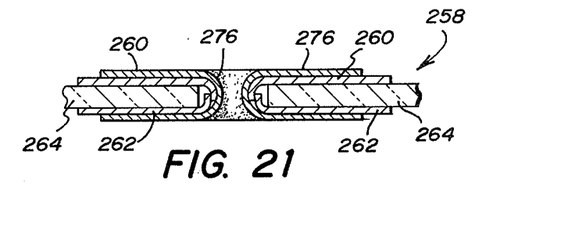
FIG. 21 is an elevation view of the junction shown in FIG. 20 with an added layer of conducting metal.

The folded connection illustrated in FIG. 20, as produced by the dies shown in FIG. 19, forms a mechanical joint while at the same time creates an electrical connection between the conducting strips. But in order to make the folded connection more permanent the connection and the associated conducting strips are coated with a metal to provide enhanced mechanical and electrical properties. This is illustrated in FIG. 21. A solder layer 276 is coated on the conducting strips 260 and 262 by passing the component board 258 through a wave solder machine or by dipping the board in molten solder. This deposits the layer of solder 276 over the connection as well as the conducting strips. The solder provides additional mechanical strength while at the same time making possible the easy connection of component leads to the component board 258. In the alternative, a layer of metal such as copper can be plated over the surface of the conducting strips 260 and 262 of the fold connection and achieve substantially the same results as that produced with the layer of solder. The metal plating will be in the same location as that of the solder layer 276 as illustrated in FIG. 21. If a metal plating is applied to the folded connection, a further solder layer can be added over the metal plating if needed.

Figure 22:
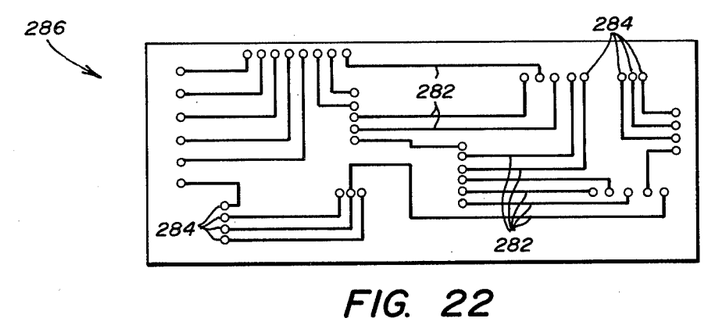
FIG. 22 is a plan view of a circuit pattern.

In the procedures described above, conducting strips on either side of an insulating plate are connected together though a hole in the plate. For a component board, there will be a plurality of conducting strips laid out in a pattern to produce the desired circuit configuration. Such a circuit connection pattern is illustrated in FIG. 22. Each of the conducting lines 282 joins together pads 284 through which the electrical connection to the opposite side of the insulating electrical connection to the opposite side of the insulating plate will be made. The combination of the conducting lines 282 with the pads 284 forms a circuit pattern 286. This pattern of conductors is also known as a foil. A plurality of circuit patterns can be produced for each component board with the patterns being layered between insulating sheets to form multi-layer boards.

A circuit pattern 286 can be produced in a manner similar to that described for the etching of a die face in reference to FIGS. 15 and 16. A sheet of copper having a backing is imprinted with a resist material in the pattern of the lines and pads shown in FIG. 22. The copper sheet is then exposed to a chemical bath which etches away the copper not protected by the resist ink in accordance with the standard industry procedures. This produces the desired circuit foil.

Another method for producing the circuit pattern 286 as illustrated in FIG. 22 comprises stamping the circuit pattern from a copper sheet with a use of a cutting die. The die face is configured to have the desired circuit pattern and is pressed against a copper sheet to cut out the desired pattern of interconnections which are then transferred to a backing sheet.

The circuit patterns produced by either of the above two methods are suitable for use in the present invention.

Figures 23, 24:
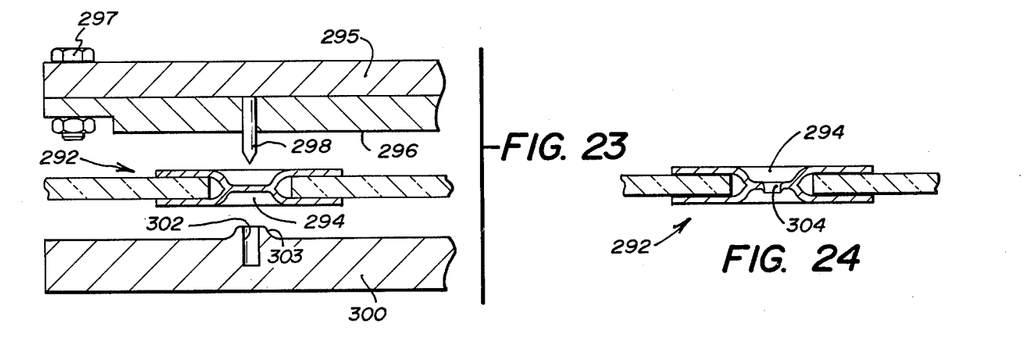
FIG. 23 is an elevation view of a projecting pin through-hole formation and sizing die.
FIG. 24 is an elevation view of a compression bond having a hole pierced therethrough by the die shown in FIG. 23.
Figure 25:
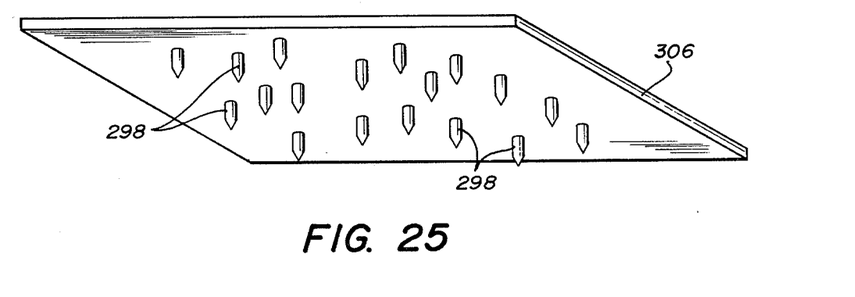
FIG. 25 is a perspective view of a die having a plurality of projecting pins for piercing compression junctions to form through holes.

After a weld is formed in accordance with the present invention between conducting sheets on opposite sheets of an insulating sheet, it is often necessary to mount a circuit component on the component board by inserting the lead through the connection junction. Depending on the die face and the pressure used to form the cold weld there may or may not be a hole already formed at the point of contact of the cold weld junction. In order to produce a hole or to produce a hole having the right size it is necessary to penetrate the zone of contact of the cold weld to produce a hole sized for insertion of the component lead. This process is illustrated in FIGS. 23, 24 and 25. A component board 292 has been compressed to form a junction 294 as previously described. In this junction no through-hole was produced in the process of forming the cold weld. To form the through-hole the component board 292 is first disposed between an upper die 296 having a projecting pin 298 disposed over the junction 294. Die 296 is connected to a supporting plate 295 by means of a bolt 297. A lower die 300 has a hole 302 disposed in the die with a surrounding lip 303 opposite the projecting pin 298. When the dies 296 and 300 are brought together the pin 296 penetrates the junction 294 and enters into the hole 302. However, the pin 298 does not strike the die 300. Pin 298 is sized to produce the desired diameter of hole or shape of hole for insertion of a component lead or other connective device. The lip 303 prevents the junction 294 from being bent downward by pin 298. The cross-section of the pin 298 can be circular or multi-sided.

A through-hole 304 produced by the projecting pin 298 is illustrated in FIG. 24. The pin 298 has penetrated the junction 294 in approximately the center thereof to produce the hole 304 having the desired size.

A complete die 306 is illustrated in FIG. 25 for producing all of the through-holes necessary for one complete component board. On the face of the die 306 there are disposed a plurality of the pins 298. These pins can be mounted on the die 306 in the same manner as the rods described in reference to FIG. 13.

A through connection can also be produced by forcing conducting strips 144 and 146, as illustrated in FIG. 11, into contact but not to form a metallurgial bond or pierce the strips. The contact is then pierced by a pin as described in reference to FIGS. 23 and 24 followed by a plating or solder coating as shown in FIG. 21. This produces a through connection without the formation of a cold weld.

The dies described in reference to FIGS. 8, 10, 12, 13, 14, 17, 19, 23, and 25 can be produced by drilling a flat metal plate with holes in the necessary locations. In the current manufacture of printed circuit boards, a numerically controlled machine is often utilized to drill the holes in the component boards in order to produce the necessary through-holes for component mounting. By use of the dies in the figures described above a plate can be drilled by the same numerically controlled machine programmed with the drilling instructions used to produce the printed circuit board through-holes to produce a die for cold weld junctions. Therefore, once the effort is invested to prepare a machine to drill the through-holes in the printed circuit board, the machine can also be used to produce the dies necessary to form the through connections.

Figure 26A:
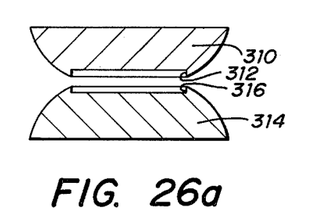
FIGS. 26a and 26b are elevation views of dies which form a cold weld while punching a hole through the conducting sheets.

As noted above, the die faces of the present invention can be shaped to not only bond the conducting materials together but to punch through the junction to form a through-hole therein. This is illustrated in FIG. 26a which comprises an upper die 310 which has a recession 312 in the face thereof. A lower die 314 likewise has an upward facing recession 316. The opposing sections of dies 310 and 314 are shaped so that the maximum extension of the die face is at the edge of the associated recession.

Figure 26B:
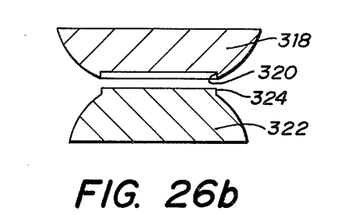

Another die set for producing a bond while at the same time producing a through-hole is illustrated in FIG. 26b. The upper die 318 has a recession 320. A lower die 322 has a projection 324 on the face of die 322, the projection 324 is sized to fit within the recession 320.

Figure 27:
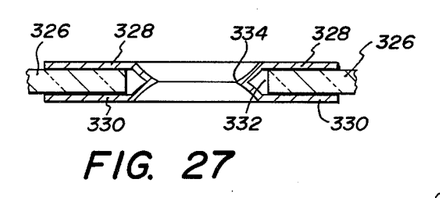
FIG. 27 is an elevation view of the connection produced by the dies illustrated in FIG. 26.

The junction formed by the dies illustrated in FIGS. 26a and 26b is shown in FIG. 27. An insulating plate 326 has conducting layers 328 and 330 on either side thereof. A hole 332 is formed in the insulating plate before the junction of the layers 328 and 330 are formed.

Referring to FIG. 26a and FIG. 27, the insulating plate 320, together with the associated conducting layers 328 and 330, are placed between the dies 310 and 314 when the layers 328 and 330 cover the hole 332. The dies 310 and 314 are brought together so that the die faces compress the layers 328 and 330 together and form a cold weld metallurgical junction between these members. The maximum extension of each die face 310 and 314 is on the edge of the respective recession 312 and 316. As a substantial force is applied on the dies, the edge of the recession cuts through the conducting materials 328 and 330 to form a hole 334 therein. Immediately adjacent the edge of the hole, the conducting layers 328 and 330 are bonded together in the metallurgical junction. The hole 334 is thus approximately the same shape as the recessions 312 and 316.

Referring to FIG. 26b and FIG. 27, the insulating plate 326 and associated conducting layers are placed between the dies 318 and 322 when the conducting layers 328 and 330 cover the hole 332. The die faces 318 and 322 are brought together with sufficient force so that the projection 324 punches through the conducting layers 328 and 330 and enters into the recession 320. The faces of the dies 318 and 320 immediately adjacent the projection 324 and recession 320 compress the conducting layers to form a cold weld metallurgical junction. The metal layer material is punched out to form the hole 334.

As shown in FIGS. 26a, 26b and 27, a hole can be formed along with a cold weld metallurgical junction, the hole being of a predetermined size to receive a component lead for attachment of the component to the insulating plate 326.

Figure 28:
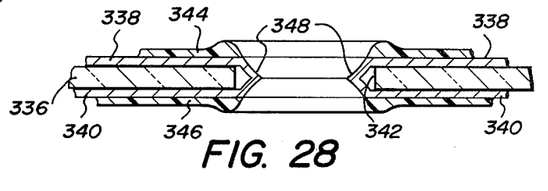
FIG. 28 is an elevation view of a junction produced by the dies shown in FIG. 1 when used with a board having an insulating layer over the conducting sheets.

The die as illustrated in FIG. 1 can also be used to produce a junction as illustrated in FIG. 28. An insulating plate 336 has conducting layers 338 and 340 on either side. A hole 342 is formed in the insulating plate 336 before the conducting layers are applied thereto. The conducting layer 338 is covered with an insulating layer 344 while the conducting layer 340 is covered with a layer of insulation 346. The component board illustrated in 346 is compressed between the die shown in FIG. 1 to produce the junction 348 illustrated in FIG. 28. The dies 20 and 21 are pressed together with sufficient force to cause the insulating layers 344 and 346 to cold flow outward and expose the underlying conducting layers 338 and 340. These conducting layers are then forced together by the die faces until a bond is formed with metallurgical junction 348.

The insulating layers 344 and 346 are a material such as KAPTON which will cold flow under pressure.

A junction produced in this manner is particularly useful where it is necessary that the conduction path be insulated at all points except where component leads are included into the component board.

Figure 29:
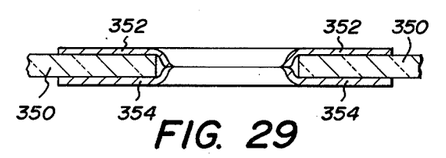
FIG. 29 is an elevation view of a non-bonding connection produced by the dies illustrated in FIG. 26.
Figure 30:
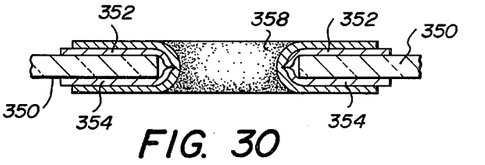
FIG. 30 is an elevation view of the junction shown in FIG. 29 with an added layer of conducting metal.

Referring to FIGS. 29 and 30, a further type of junction is produced by the dies illustrated in FIG. 1. An insulating plate 350 having conducting layers 352 and 354 is compressed between dies 20 and 21 to puncture the conducting layers 352 and 354, but not with sufficient force to form a cold weld metallurgical junction between these layers. A metallurgical junction may fail to be produced not only as a result of insufficient force but by having the surfaces of the conducting layers coated with a material such as oil or oxide. In this case, the layers are pressed into contact but are not cold flowed to produce a metallic junction. A solid connection can, however, be formed as shown in FIG. 30 by wave soldering the component board which applies a coating of solder 356 over the metallic layers 352 and 354. This solder coating provides both an electrical connection between the layers and a mechanical bond to hold the edges of the layers in position in a hole in the insulating plate 350. A solder layer 358 can also be applied by dipping the component board into molten solder. Further, a layer of metal, such as copper, can be plated over the conducting layers 352 and 354 in the same position shown for the solder layer 358 to provide the same results as provided by the solder layer 358.

Figures 31, 32:
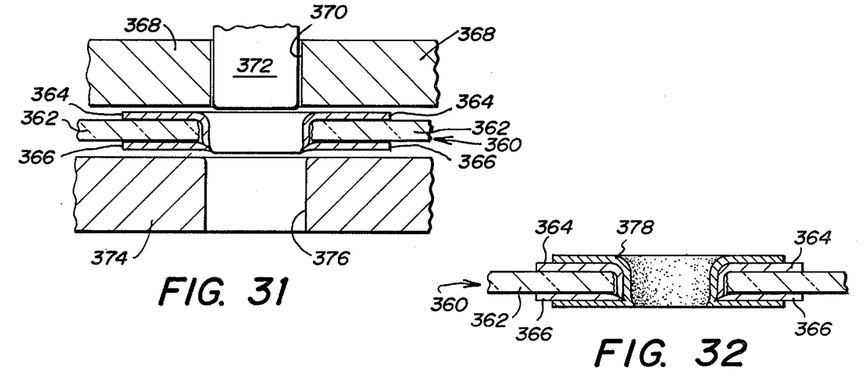
FIG. 31 is an elevation view of a die together with an insulating plate having conducting layers thereon, the die having punched a hole through the insulating plate and connected the conducting layers.
FIG. 32 is an elevation view of the insulating board and conducting layers shown in FIG. 31 with an added layer of conducting metal.

Referring to FIGS. 31 and 32, a component board 360 has a solid layer of insulating material 362 which is coated on either side with layers of conducting materials 364 and 366. An upper die 368 has a hole 370 therein which contains a movable die punch 372. A lower die 374 has a hole 376 therein which is in alignment with the die punch 372. The die punch 372 is of lesser diameter than the hole 376 but is of sufficient length to extend therein.

In contrast to the previous component boards discussed, the component board 360 is not formed with a hole therein between the conducting layers 364 and 366. In this embodiment, the hole and bond are produced simultaneously by driving the die punch 372 through the component board 360 into a hole 376. The die punch 372 is shaped with very slightly rounded edges such that the conducting layer 364 is deformed downward while the material in the insulating plate 362 is broken away under the pressure of the die punch 372. The insulating plate material thus punched out is expelled through hole 376. The die punch 372 forces the conducting layer 364 downward until it meets with the conducting layer 366 where the two conducting layers are forced together. Due to the presence of the insulating layer 362 it is difficult to form a cold weld junction between the conducting layers 364 and 366, however, the conducting layers will be touching each other so as to form an electrical connection.

Referring to FIG. 32, a solid mechanical and electrical connection is formed between the conducting layers 354 and 356 by applying a layer of solder 378 over the conducting layers 364 and 366. The solder layer 378 can be applied by wave soldering the component board 360 or by dipping the board in molten solder. Alternatively, the conducting layers 364 and 366 can be plated with a metal, such as copper, in the same location shown for solder layer 378 to provide the electrical connection and mechanical rigidity which is provided by the solder layer.

The process of forming cold welds as described for each operation above can be enhanced by additional operations. If the electrical conductors are vibrated at the time of being forced together, the compression force for forming the cold weld can be reduced. Likewise, if the conductors are heated, but not to the melting point, a weld is formed with less force. And, if the electrical conductors are bonded in an atmosphere comprising an inert gas and the conductor surfaces are clean, the bonding can be accomplished with much less force.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

I claim:

1. A method for establishing an electrically conductive path through an insulating plate which comprises the steps of:
   (a) forming a hole through said plate,
   (b) placing conductive material over each opening of said hole and in flush contact with each surface of said plate, and
   (c) disposing the assembly in a press with said through holes located between opposed non-planar pressing members.
   (d) applying pressure to cause said conductive material to merge and flow outwards between pressing members to produce a cold weld.

2. The method of claim 1 including the step of heating the conductive materials to facilitate the cold welding.

3. The method of claim 1, wherein the opposed pressing members are pressed substantially together to provide a through hole in the conductive material.

4. A method for establishing an electrically conductive path through an insulating plate which comprises the steps of:
   (a) forming a hole through said plate,
   (b) placing conductive material over each opening of said hole and in flush contact with each surface of said plate,
   (c) enveloping said conductive materials in an inert atmosphere,
   (d) applying opposed forces to said conductive materials to drive them into contact through said hole to form a metallurgical junction between said conductive materials.

5. A method for establishing an electrically conductive path through an insulating plate which comprises the steps of:
   (a) forming a hole through said plate,
   (b) placing conductive material over each opening of said hole and in flush contact with each surface of said plate,
   (c) enveloping said conductive material in an inert atmosphere and
   (d) applying a force against a first of said conductive materials to drive it through said hole and into contact with a second of said conductive materials where said force is of magnitude and character to produce a metallurgical junction between said conductive materials at the zone of contact.

6. A method for forming an electrically conductive through-hole in an insulating plate comprising the steps of:
   (a) forming a hole through said plate,
   (b) placing conductive material over each opening of said hole and in flush contact with each surface of said plate,
   (c) applying a force to a first of said conductive materials to force said first conductive material into contact with a second of said conductive materials where said force is of magnitude to produce a cold weld metallurgical junction between said conductive materials and form a hole through said conductive materials in the zone of contact.

7. A method for forming an electrically conductive through-hole in an insulating plate comprising the steps of:
   (a) forming a hole through said plate;
   (b) placing conductive material over each opening of said hole and in flush contact with each surface of said plate,
   (c) applying a force to a first of said conductive materials to force said first conductive material into contact with a second of said conductive materials where said force is of magnitude and character to produce a metallurgical junction between said conductive materials and form a hole through said conductive materials in the zone of contact, said metallurgical junction formed by vibrating at least that portion of said conductive materials in the zone of contact to cause said conductive materials metallurgically to bond at point of said contact.

8. A method for forming an electrically conductive through-hole in an insulating plate comprising the steps of:
   (a) forming a hole through said plate,
   (b) placing conductive material over each opening of said hole and in flush contact with each surface of said plate,
   (c) enveloping said conductive material in an inert atmosphere and
   (d) applying a force to a first of said conductive materials to force said first conductive material into contact with a second of said conductive materials where said force is of magnitude and character to produce a metallurgical junction between said conductive materials and form a hole through said conductive materials in the zone of contact.

9. A method for producing an electrically conductive path through an insulating member comprising the steps of:
   (a) forming a hole in said insulating member,
   (b) placing an electrical conductor on each side of said insulating member over said hole and flush with a surface of said insulating member,
   (c) positioning said insulating member and said electrical conductors between a first plate and a second plate having a struck up member aligned with said hole, said struck up member having a convexly rounded face, and
   (d) forcing said first and said second plates together with a force of magnitude and character to extrude material of said electrical conductors outwards from between said struck up member and said second plate and to produce a cold weld junction between said electrical conductors in the zone of said hole by the compression of said electrical conductors between the face of said struck up member and said first plate.

10. A method for producing an electrically conductive path through an insulating member comprising the steps of:
   (a) forming a hole in said insulating member,
   (b) placing an electrical conductor on each side of said insulating member over said hole and flush with a surface of said insulating member,
   (c) positioning said insulating member and said electrical conductors between a first plate and a second plate having a struck up member aligned with said hole, said struck up member having a rounded face,
   (d) enclosing said electrical conductors in an inert gas in the zone of said hole while said electrical conductors are being compressed together, and
   (e) forcing said first and said second plates together with a force of magnitude and character to produce a cold weld junction between said electrical conductors in the zone of said hole by the compression of said electrical conductors between the face of said struck up member and said first plate.

11. A method for producing an electrically conductive path as recited in claim 9 further including the step of covering said electrical conductors with a layer of solder in the zone of said junction after the production of said cold weld junction.

12. A method for producing an electrically conductive path as recited in claim 9 further including the step of plating a conductive metal onto said electrical conductors in the zone of said junction after the production of said cold weld junction.

13. A method for producing an electrically conductive path through an insulating member comprising the steps of:
(a) forming a hole in said insulating member,
(b) placing an electrical conductor on each side of said insulating member over said hole and flush with a surface of said insulating member,
(c) positioning said insulating member and said electrical conductors between a first plate having a flat surface and a second plate having a sphere disposed in and protruding above the surface thereof, said sphere aligned with said hole, and
(d) forcing said first and said second plates together with a force of magnitude and character to produce a cold weld junction between said electrical conductors in the zone of said hole by the compression of said electrical conductors between said sphere and the flat surface of said first plate.

14. A method for producing an electrically conductive path as recited in claim 13 further including the step of vibrating said electrical conductors in the zone of said hole while said electrical conductors are being compressed together.

15. A method for producing an electrically conductive path as recited in claim 13 further including the step of enclosing said electrical conductors in an inert gas in the zone of said hole while said electrical conductors are being compressed together.

16. A method for producing an electrically conductive path as recited in claim 13 further including the step of covering said electrical conductors with a layer of solder in the zone of said junction.

17. A method for producing an electrically conductive path as recited in claim 13 further including the step of plating a conductive metal onto said electrical conductors in the zone of said junction.

18. A method for producing an electrically conductive path through an insulating member comprising the steps of:
(a) forming a hole in said insulating member,
(b) placing an electrical conductor on each side of said insulating member over said hole and flush with a surface of said insulating member,
(c) positioning said insulating member and said electrical conductors between a first plate having a sphere disposed in and protruding above the surface thereof and a second plate having a second sphere disposed in and protruding above the surface thereof, said spheres aligned with said hole, and
(d) forcing said first and said second plates together with a force of magnitude and character to produce a cold weld junction between said electrical conductors in the zone of the said hole by the compression of said electrical conductors between said spheres.

19. A method for producing an electrically conductive path as recited in claim 18 further including the step of vibrating said electrical conductors in the zone of said hole while said electrical conductors are being compressed together.

20. A method for producing an electrically conductive path as recited in claim 18 further including the step of enclosing said electrical conductors in an inert gas in the zone of said hole while said electrical conductors are being compressed together.

21. A method for producing an electrically conductive path as recited in claim 18 further including the step of covering said electrical conductors with a layer of solder in the zone of said junction.

22. A method for producing an electrically conductive path as recited in claim 18 further including the step of plating a conductive metal over said electrical conductors in the zone of said junction.

23. a method for producing an electrically conductive path through an insulating member comprising the steps of:
(a) forming a first hole in said insulating member,
(b) placing an electrical conductor on each side of said insulating member over said first hole and flush with a surface of said insulating member,
(c) forming a second hole in a first plate,
(d) mounting a rod in said second hole said rod protruding above the surface of said first plate said rod having a convexly rounded tip.
(e) positioning said insulating member and said electrical conductors between said first plate and a second plate, said first hole aligned with said rod, and
(f) forcing said first and said second plates together with a force of magnitude and character to produce a cold weld junction between said electrical conductors in the zone of said first hole by the compression of said electrical conductors between the tip of said rod and said second plate.

24. A method for producing an electrically conductive path through an insulating member comprising the steps of:
(a) forming a first hole in said insulating member,
(b) placing an electrical conductor on each side of said insulating member over said first hole and flush with a surface of said insulating member,
(c) forming a second hole in a first plate,
(d) mounting a rod in said second hole said rod protruding above the surface of said first plate, said rod having a rounded tip,
(e) positioning said insulating member and said electrical conductors between said first plate and a second plate, said first hole aligned with said rod,
(f) vibrating said electrical conductors in the zone of said first hole while said electrical conductors are being compressed together, and
(g) forcing said first and said second plates together with a force of magnitude and character to produce a cold weld junction between said electrical conductors in the zone of said first hole by the compression of said electrical conductors between the tip of said rod and said second plate.

25. A method for producing an electrically conductive path through an insulating member comprising the steps of:
(a) forming a first hole in said insulating member, (b) placing an electrical conductor on each side of said insulating member over said first hole and flush with a surface of said insulating member, (c) forming a second hole in a first plate, (d) mounting a rod in said second hole and said rod protruding above the surface of said first plate, said rod having a rounded tip, (e) positioning said insulating member and said electrical conductors between said first plate and a second plate, said first hole aligned with said rod, (f) enclosing said electrical conductors in an inert gas in the zone of said first hole while said electrical conductors are being compressed together, (g) forcing said first and said second plates together with a force of magnitude and character to produce a cold weld junction between said electrical conductors in the zone of said first hole by the compression of said electrical conductors between the tip of said rod and said second plate.

26. A method for producing an electrically conductive path as recited in claim 23 further including the step of covering said electrical conductors with a layer of solder in the zone of said junction after the production of said cold weld junction.

27. A method for producing an electrically conductive path as recited in claim 23 further including the step of plating a conductive metal into said electrical conductors in the zone of said junction after the production of said cold weld junction.

28. A method for producing an electrically conductive path through an insulating member comprising the steps of:

(a) forming a first hole in said insulating member, (b) placing an electrical conductor on each side of said insulating member over said first hole and flush with a surface of said insulating member, (c) forming a second hole in first plate, (d) mounting a rod in said second hole, said rod having a convexly rounded tip protruding above the surface of said first plate.

(e) forming a third hole in a second plate, (f) mounting a second rod having a convexly rounded tip said third hole in said second plate opposite said first plate and protruding above said second plate, (g) positioning said insulating member and said electrical conductors between said first plate and said second plate, said first hole aligned between said first rod and said second rod, and (h) forcing said first and said second plates together with a force of magnitude and character to produce a cold weld junction between said electrical conductors in the zone of said first hole by the compression of said electrical conductors between tips of said rod.

29. A method for producing an electrically conductive path through an insulating member comprising the steps of:

(a) forming a first hole in said insulating member, (b) placing an electrical conductor on each side of said insulating member over said first hole and flush with a surface of said insulating member, (c) forming a second hole in a first plate, (d) mounting a rod in said second hole, said rod protruding above the surface of said first plate and having a rounded tip, (e) forming a third hole in a second plate, (f) mounting a second rod in said third hole in said second plate opposite said first plate and protruding above said second plate and having a rounded tip, (g) positioning said insulating member and said electrical conductors between said first plate and said second plate said first hole aligned between said first rod and said second rod, (h) vibrating said electrical conductors in the zone of said first hole while said electrical conductors are being compressed together, and (i) forcing said first and said second plates together with a force of magnitude and character to produce a cold weld junction between said electrical conductors in the zone of said first hole by the compression of said electrical conductors between the tips of said rods.

30. A method for producing an electrical conductive path through an insulating member comprising the steps of:

(a) forming a first hole in said insulating member, (b) placing an electrical conductor on each side of said insulating member over said first hole and flush with a surface of said insulating member, (c) forming a second hole in a first plate, (d) mounting a rod in said second hole, said rod protruding above the surface of said first plate and having a rounded tip, (e) forming a third hole in a second plate, (f) mounting a second rod in said third hole in said second plate opposite said first plate and protruding above said second plate and having a rounded tip, (g) positioning said insulating member and said electrical conductors between said first plate and said second plate said first hole aligned between said first rod and said second rod, (h) enclosing said electrical conductors in an inert gas in the zone of said first hole while said electrical conductors are being compressed together, and (i) forcing said first and said second plates together with a force of magnitude and character to produce a cold weld junction between said electrical conductors in the zone of said first hole by the compression of said electrical conductors between the tips of said rods.

31. A method for producing an electrically conductive path as recited in claim 28 further including the step of covering said electrical conductors with a layer of solder in the zone of said junction after the production of the cold weld junction.

32. A method for producing an electrically conductive path as recited in claim 28 further including the step of plating a conductive metal onto said electrical conductors in the zone of said junction after the production of the cold weld junction.

33. Apparatus for forcing together selected areas of conduction members disposed on opposite sides of an insulating member through a hole in the insulating member to form a cold weld junction between said conduction members, comprising in combination:

(a) a first plate and second opposed plate, (b) a plurality of opposed projecting members extending from the surface of said first plate and said second plate, (c) an opposed convexly rounded face on each of said projecting members, (d) means for positioning said insulating member between said first and second plates to align said areas of said conduction members to be welded with said projecting member, and (e) means for driving said first and said second plates together to compress said conduction members together between said faces of said projecting members with sufficient force to form a cold weld junction between said conduction members in the zone of said hole.

34. Apparatus as recited in claim 33 wherein said projecting member of said first plate comprise a rigid sphere disposed in a hole in said first plate, said sphere projecting above the surface of said first plate.

35. Apparatus as recited in claim 33 within said projecting members of said first plate comprise a rod disposed in a hole in said first plate, said rod projecting above the surface of said first plate.

36. Apparatus as recited in claim 33 further including a third plate mounted flush against the surface of said first plate opposite said second plate, and said projecting members of said first plate are disposed in a hole passing through said first plate.

37. A method for producing an offset junction that electrically connects conductors on opposite sides of an insulating member, comprising the steps of:

(a) forming a hole in said insulating member between said conductors, (b) positioning said conductors and said insulating member between a first plate having a projection in the face thereof and a second plate having an indentation in the face thereof opposite of said projection, said indentation dimensioned to receive said projection and said hole aligned between said projection and said indentation, and (c) forcing said first and said second plates together with a force of magnitude and character to produce a cold weld junction between said conductors in the zone of said hole by the compression of said conductors between said projection and said second plate within said indentation, said junction offset from the plane of said insulating member.

38. A method for producing an offset junction as recited in claim 37 further including the step of vibrating said conductors in the zone of said hole while said conductors are being compressed together.

39. A method for producing an offset junction as recited in claim 37 further including the step of heating said conductors in the zone of said hole to a temperature below the melting point of said conductors while said conductors are being compressed together.

40. A method for producing an offset junction as recited in claim 37 further including the step of enclosing said conductors in an inert gas in the zone of said hole while said conductors are being compressed together.

41. A method for producing an offset junction as recited in claim 37 further including the step of covering said conductors with a layer of solder in the zone of said junction.

42. A method for producing an offset junction as recited in claim 37 further including the step of plating a conductive metal over said conductors in the zone of said junction.

43. A method for establishing an electrically conductive path through an insulating plate comprising the steps of:

(a) forming a hole through said plate, (b) placing conductive material over each opening of said hole in flush contact with each surface of said plate, (c) applying opposed forces against said conductive materials by opposed rounded tools where said forces are of magnitude and character to penetrate said conductive materials and form a hole and drive them into contact to form a joint, and (d) coating a conductive metal over said conductive materials in the zone of said hole to provide said electrically conductive path between said conductive materials.

44. The method as recited in claim 43 wherein said step of coating a conductive metal comprises wave soldering said conductive materials.

45. The method as recited in claim 43 wherein said step of coating a conductive metal comprises dipping said conductive material into molten solder.

46. The method as recited in claim 43 wherein said step of coating a conductive metal comprises plating said metal onto said conductive materials.

47. A method for establishing an electrically conductive path through an insulating plate comprising the steps of:

(a) forming a hole through said plate, (b) placing conductive material on each side of said plate covering said hole, (c) covering each said conductive material with a deformable insulation material on the surface thereof opposite said insulating plate and (d) applying opposed forces against said insulation materials and said conductive materials to deform said insulation materials to expose said conductive materials, said forces of a magnitude and character to drive said conductive materials into contact through said hole and produce a metallurgical junction between said conductive materials in the zone of contact.

48. The method as recited in claim 47 further including the step of coating said conductive materials in the zone of contact with a conductive metal.

* * * * *